US012573986B2

(12) United States Patent
Sakata et al.

(10) Patent No.: US 12,573,986 B2
(45) Date of Patent: Mar. 10, 2026

(54) AMPLIFIER CIRCUIT

(71) Applicant: MITSUBISHI ELECTRIC CORPORATION, Tokyo (JP)

(72) Inventors: Shuichi Sakata, Tokyo (JP); Yuji Komatsuzaki, Tokyo (JP); Shintaro Shinjo, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 665 days.

(21) Appl. No.: 17/960,884

(22) Filed: Oct. 6, 2022

(65) Prior Publication Data

US 2023/0026142 A1     Jan. 26, 2023

Related U.S. Application Data

(63) Continuation of application No. PCT/JP2020/022456, filed on Jun. 8, 2020.

(51) Int. Cl.
  *H03F 1/02* (2006.01)
  *H03F 1/56* (2006.01)
  *H03F 3/68* (2006.01)

(52) U.S. Cl.
  CPC ........... *H03F 1/565* (2013.01); *H03F 1/0288* (2013.01); *H03F 3/68* (2013.01); *H03F 2200/102* (2013.01); *H03F 2200/318* (2013.01)

(58) Field of Classification Search
  CPC .......... H03F 1/565; H03F 1/0288; H03F 3/68; H03F 2200/102; H03F 2200/318;
  (Continued)

(56) References Cited

U.S. PATENT DOCUMENTS 6,812,794 B1    11/2004   Mori et al.
9,479,119 B2    10/2016   Kikuchi et al.
(Continued)

FOREIGN PATENT DOCUMENTS

CN            1346538 A      4/2002
JP        2014-116757 A      6/2014
(Continued)

OTHER PUBLICATIONS

Chinese Office Action and Search Report for Chinese Application No. 202080100358.5, dated Oct. 15, 2024, with English translation.
European Communication pursuant to Article 94(3) EPC for European Application No. 20939853.6, dated Mar. 18, 2025.
"Maximum power transfer theorem," Wikipedia, Jan. 22, 2020, XP093139773, pp. 1-6, URL: <https://en.wikipedia.org/w/index.php?title=Maximum_power_transfer_theorem&oldid=937038651>.
(Continued)

*Primary Examiner* — Andrea Lindgren Baltzell
*Assistant Examiner* — Khiem D Nguyen
(74) *Attorney, Agent, or Firm* — BIRCH, STEWART, KOLASCH & BIRCH, LLP

(57) ABSTRACT

An amplifier circuit is configured in such a way that the amplifier circuit includes: a first amplifier to amplify a signal to be amplified; an output matching circuit through which the signal amplified by the first amplifier propagates; and a second amplifier to amplify the signal which has propagated through the output matching circuit, and the output matching circuit is a lumped constant circuit including multiple lumped constant elements, and, by using the multiple lumped constant elements, transforms the impedance seen on the second amplifier side from the first amplifier when the output power of the second amplifier is lower than saturation electric power, to impedance higher than impedance seen on the second amplifier side from the first amplifier when the output power of the second amplifier is equal to the saturation electric power.

7 Claims, 6 Drawing Sheets

(58) Field of Classification Search
CPC .... H03F 2200/451; H03F 1/0211; H03F 3/19;
H03F 2200/411
USPC ....................................................... 330/295
See application file for complete search history.

(56) References Cited

U.S. PATENT DOCUMENTS

| | | | |
|---|---|---|---|
| 10,530,306 B2 | 1/2020 | Srinidhi Embar et al. | |
| 2011/0043285 A1 | 2/2011 | Zhao et al. | |
| 2011/0050350 A1* | 3/2011 | Honjo ........................ | H03F 3/66 |
| | | | 330/302 |
| 2011/0316636 A1 | 12/2011 | Zhao et al. | |
| 2015/0311869 A1 | 10/2015 | Kikuchi et al. | |
| 2017/0244369 A1 | 8/2017 | Mimis et al. | |

FOREIGN PATENT DOCUMENTS

| | | |
|---|---|---|
| JP | 2014-239472 A | 12/2014 |
| JP | 2017-529747 A | 10/2017 |

OTHER PUBLICATIONS

European Communication pursuant to Article 94(3) EPC for European Application No. 20939853.6, dated Mar. 21, 2024.

International Search Report (PCT/ISA/210) issued in PCT/JP2020/022456, dated Jul. 21, 2020.

Written Opinion of the International Searching Authority (PCT/ISA/237) issued in PCT/JP2020/022456, dated Jul. 21, 2020.

Extended European Search Report for European Application No. 20939853.6, dated Jun. 1, 2023.

European Office Action for European Application No. 20 939 853.6, dated Sep. 5, 2024.

Chinese Office Action for Chinese Application No. 202080100358.5, dated Apr. 10, 2025, with English translation.

European Office Action for European Application No. 20 939 853.6, dated Oct. 10, 2025.

Unknown, "Distributed-Element Circuit," The free Encyclopedia, Oct. 27, 2019, XP093322321, pp. 1-18.

* cited by examiner

AMPLIFIER CIRCUIT

CROSS REFERENCE TO RELATED APPLICATIONS

This application is a Continuation of PCT International Application No. PCT/JP2020/022456, filed on Jun. 8, 2020, which is hereby expressly incorporated by reference into the present application.

TECHNICAL FIELD

The present disclosure relates to an amplifier circuit that amplifies a signal.

BACKGROUND ART

Among amplifier circuits, there are some amplifier circuits each of which includes a first amplifier and a second amplifier and each of in which the second amplifier is connected in series to an output side of the first amplifier.

In Patent Literature 1 below, an amplifier circuit in which a drive amplifier is used as a first amplifier and a Doherty amplifier is used as a second amplifier is disclosed. In the amplifier circuit, an impedance adjustment unit is connected between the drive amplifier and the Doherty amplifier.

The impedance adjustment unit includes a matching circuit that matches the output load impedance of the drive amplifier with the input impedance of the Doherty amplifier, and a phase adjuster that adjusts the phase of a signal outputted from the matching circuit to the Doherty amplifier. The phase adjuster's adjustment of the phase of the signal makes it possible to improve the efficiency of the drive amplifier when the output power of the Doherty amplifier is lower than saturation electric power.

CITATION LIST

Patent Literature

Patent Literature 1: JP 2014-116757 A

SUMMARY OF INVENTION

Technical Problem

In the amplifier circuit disclosed in Patent Literature 1, the impedance adjustment unit includes the phase adjuster. The phase adjuster is a distributed constant circuit constituted by a transmission line. A problem with the amplifier circuit disclosed in Patent Literature 1 is that its circuit size is large because the amplifier circuit includes the phase adjuster constituted by a distributed constant circuit.

The present disclosure is made in order to solve the above-mentioned problem, and it is therefore an object of the present disclosure to obtain an amplifier circuit that makes it possible to improve the efficiency of a first amplifier when the output power of a second amplifier is lower than saturation electric power, without having to use a distributed constant circuit.

Solution to Problem

According to the present disclosure, there is provided an amplifier circuit including: a first amplifier to amplify a signal to be amplified; an output matching circuit through which the signal amplified by the first amplifier propagates;

and a second amplifier to amplify the signal which has propagated through the output matching circuit, in which the output matching circuit is a lumped constant circuit including multiple lumped constant elements, and, by using the multiple lumped constant elements, transforms impedance seen on a side of the second amplifier from the first amplifier when output power of the second amplifier is lower than saturation electric power, to impedance higher than impedance seen on the side of the second amplifier from the first amplifier when the output power of the second amplifier is equal to the saturation electric power.

Advantageous Effects of Invention

According to the present disclosure, the efficiency of the first amplifier when the output power of the second amplifier is lower than the saturation electric power can be improved without having to use a distributed constant circuit.

DESCRIPTION OF EMBODIMENTS

Hereinafter, in order to explain the present disclosure in greater detail, embodiments of the present disclosure will be explained with reference to the accompanying drawings.

Embodiment 1

Figure 1:
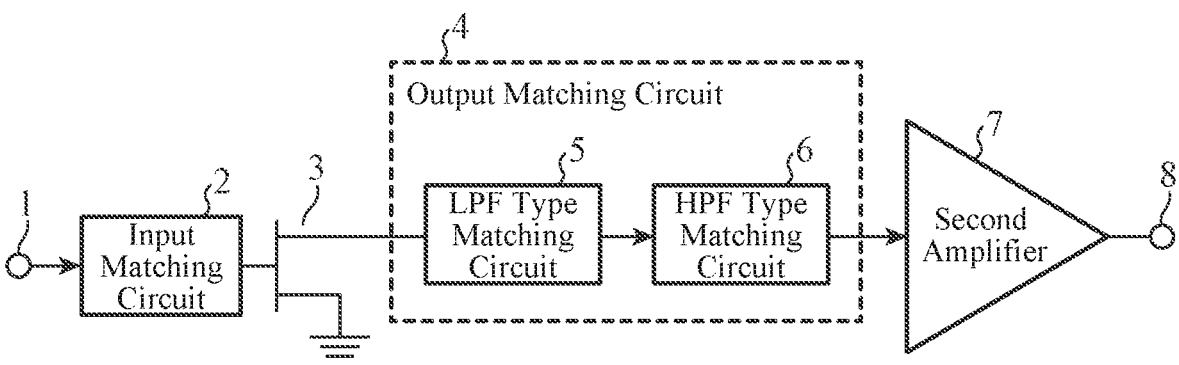
FIG. 1 is a block diagram showing an amplifier circuit according to Embodiment 1.

FIG. 1 is a block diagram showing an amplifier circuit according to Embodiment 1.

The amplifier circuit shown in FIG. 1 includes an input terminal 1, an input matching circuit 2, a first amplifier 3, an output matching circuit 4, a second amplifier 7 and an output terminal 8.

To the input terminal 1, a signal to be amplified is supplied.

One end of the input matching circuit 2 is connected to the input terminal 1.

The other end of the input matching circuit 2 is connected to an input side of the first amplifier 3.

The input matching circuit 2 is implemented by, for example, lumped constant elements.

The input matching circuit 2 matches the input impedance of the first amplifier 3 with the impedance of an input side of the amplifier circuit shown in FIG. 1.

The first amplifier 3 is implemented by, for example, a field effect transistor (FET), a heterojunction bipolar transistor (HBT) or a high electron mobility transistor (HEMT).

The first amplifier 3 amplifies the signal to be amplified which has propagated through the input matching circuit 2, and outputs the amplified signal to the output matching circuit 4.

One end of the output matching circuit 4 is connected to an output side of the first amplifier 3.

The other end of the output matching circuit 4 is connected to an input side of the second amplifier 7.

The output matching circuit 4 is a lumped constant circuit having lumped constant elements.

More specifically, the output matching circuit 4 includes a low pass filter (LPF) type matching circuit 5 having a lumped constant element, and a high pass filter (HPF) type matching circuit 6 having lumped constant elements.

The output matching circuit 4 is the one through which the signal amplified by the first amplifier 3 propagates.

Using the multiple lumped constant elements, the output matching circuit 4 transforms the impedance seen on the second amplifier 7 side from the first amplifier 3 when the output power of the second amplifier 7 is lower than saturation electric power, to impedance higher than the impedance seen on the second amplifier 7 side from the first amplifier 3 when the output power of the second amplifier 7 is equal to the saturation electric power.

Because the output matching circuit 4 is the lumped constant circuit, its circuit size is smaller than that of an output matching circuit constituted by a distributed constant circuit.

One end of the LPF pattern matching circuit 5 is connected to the output side of the first amplifier 3.

The other end of the LPF pattern matching circuit 5 is connected to one end of the HPF pattern matching circuit 6.

The LPF pattern matching circuit 5 has an inductor as the lumped constant element, for example.

The one end of the HPF type matching circuit 6 is connected to the other end of the LPF type matching circuit 5.

The other end of the HPF type matching circuit 6 is connected to the input side of the second amplifier 7.

The HPF type matching circuit 6 has an inductor and capacitors as the lumped constant elements, for example.

Figure 2:
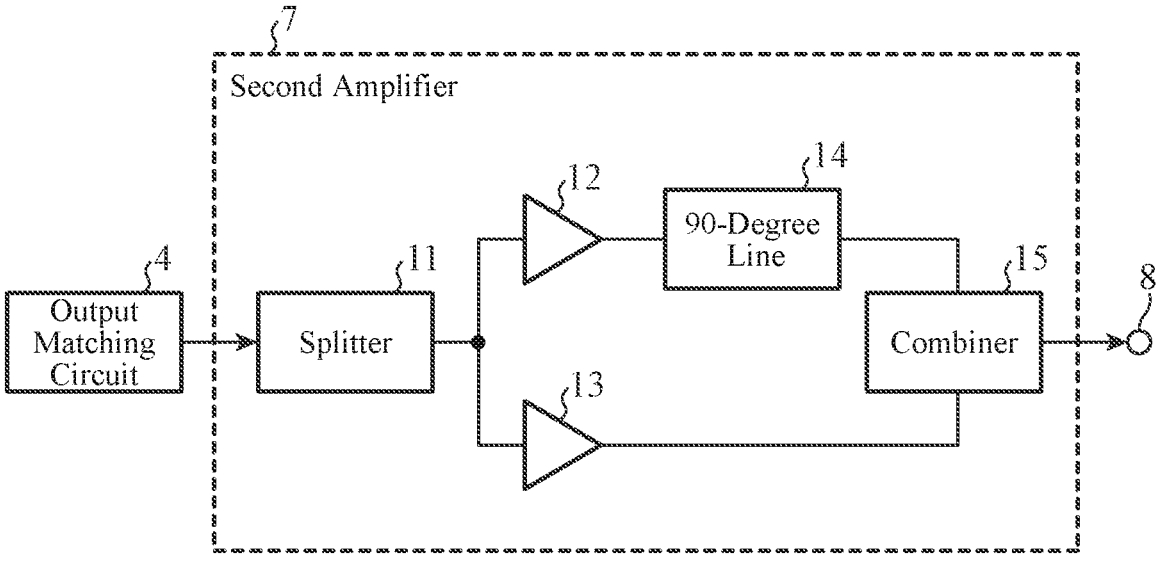
FIG. 2 is a schematic diagram showing a second amplifier 7 implemented by a Doherty amplifier.

The second amplifier 7 is implemented by, for example, a Doherty amplifier as shown in FIG. 2.

The second amplifier 7 amplifies the signal which has propagated through the output matching circuit 4.

The second amplifier 7 outputs the amplified signal to the output terminal 8.

The output terminal 8 is the one via which the signal amplified by the second amplifier 7 is outputted to the outside.

FIG. 2 is a schematic diagram showing the second amplifier 7 which is implemented by the Doherty amplifier.

The Doherty amplifier shown in FIG. 2 includes a splitter 11, a carrier amplifier 12, a peak amplifier 13, a 90-degree line 14 and a combiner 15.

The splitter 11 splits the signal which has propagated through the output matching circuit 4 into two signals, and outputs one of the signals to the carrier amplifier 12 and outputs the other signal to the peak amplifier 13.

The carrier amplifier 12 amplifies the one of the signals outputted from the splitter 11 and outputs the amplified signal to the 90-degree line 14.

When the signal level of the other signal outputted from the splitter 11 is higher than a constant level, the peak amplifier 13 amplifies this signal and outputs the amplified signal to the combiner 15.

The 90-degree line 14 is intended for making the electric length of a line on an output side of the carrier amplifier 12 equal to 90 degrees.

The combiner 15 combines the signal which has propagated through the 90-degree line 14 and the signal amplified by the peak amplifier 13, and outputs a composite signal of the two signals.

Figure 3:
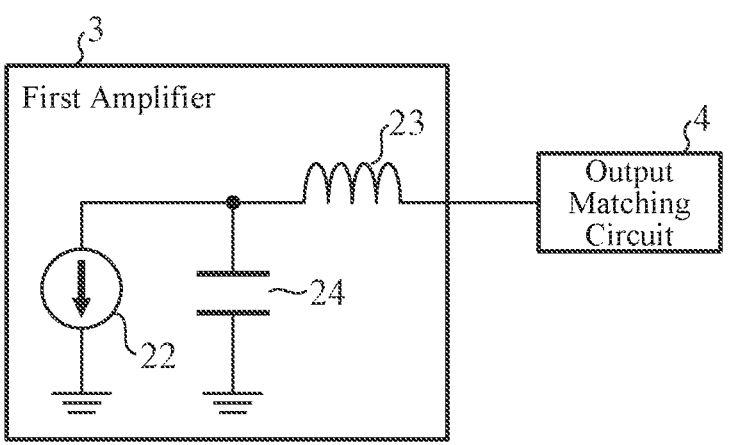
FIG. 3 is an equivalent circuit diagram showing an equivalent circuit of a first amplifier 3 included in the amplifier circuit according to Embodiment 1.

FIG. 3 is an equivalent circuit diagram showing an equivalent circuit of the first amplifier 3 included in the amplifier circuit according to Embodiment 1.

The equivalent circuit of the first amplifier 3 is represented by a current source 22, an inductor 23 and a capacitor 24, as shown in FIG. 3.

The current source 22 outputs a current which increases with increase in the signal level of the signal to be amplified which has propagated through the input matching circuit 2.

The inductor 23 is a part of a parasitic component from the current source 22 to one end of the LPF type matching circuit 5.

The capacitor 24 is a part of the parasitic component from the current source 22 to the one end of the LPF type matching circuit 5.

The parasitic component included in the first amplifier 3, i.e., the parasitic element from the current source 22 to the one end of the LPF type matching circuit 5 is represented by the inductor 23 and the capacitor 24.

Figure 4:
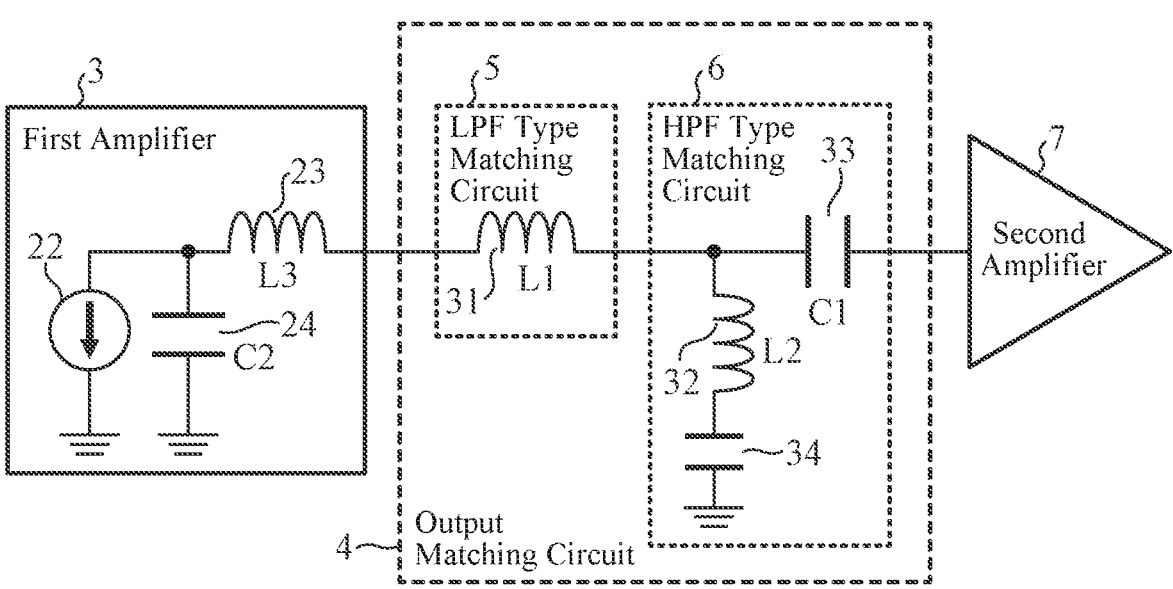
FIG. 4 is a schematic diagram showing an example of a lumped constant element included in an LPF type matching circuit 5, and an example of lumped constant elements included in an HPF type matching circuit 6.

FIG. 4 is a schematic diagram showing an example of the lumped constant element included in the LPF type matching circuit 5 and an example of the lumped constant elements included in the HPF type matching circuit 6.

The LPF type matching circuit 5 includes a first inductor 31 as the lumped constant element.

One end of the first inductor 31 is connected to the output side of the first amplifier 3.

The other end of the first inductor 31 is connected to each of one ends of a second inductor 32 and a capacitor 33 which are included in the HPF type matching circuit 6.

The HPF type matching circuit 6 includes the second inductor 32, the capacitor 33 and a direct current (DC) blocking capacitor 34 as the lumped constant elements.

The one end of the second inductor 32 is connected to each of the following ends: the other end of the first inductor 31 and one end of the capacitor 33.

The other end of the second inductor 32 is connected to one end of the DC blocking capacitor 34.

The one end of the capacitor 33 is connected to each of the following ends: the other end of the first inductor 31 and the one end of the second inductor 32.

The other end of the capacitor 33 is connected to the input side of the second amplifier.

The one end of the DC blocking capacitor 34 is connected to the other end of the second inductor 32.

The other end of the DC blocking capacitor 34 is grounded.

Figure 7:
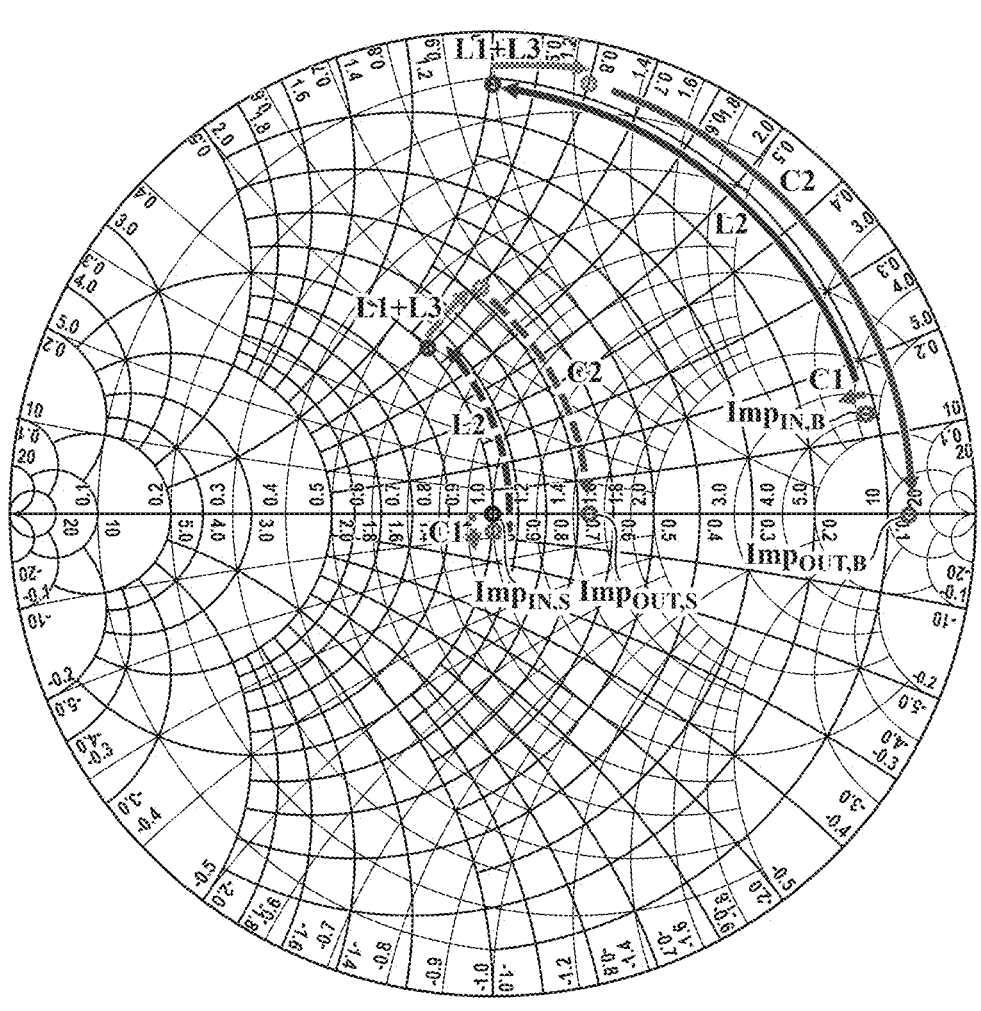
FIG. 7 is a Smith chart showing an example of impedance transformation by an output matching circuit 4.

The HPF type matching circuit 6 shown in FIG. 7 includes the DC blocking capacitor 34. However, this is only an example, and the HPF type matching circuit 6 may not include the DC blocking capacitor 34 and the other end of the second inductor 32 may be grounded.

Next, the operation of the amplifier circuit shown in FIG. 1 will be explained.

The second amplifier 7 is implemented by the Doherty amplifier as shown in FIG. 2. Therefore, the input impedance $Imp_{IN}$ of the second amplifier 7 varies during a time period from a time of backoff to a time of saturation, as shown in FIG. 5.

Here, the time of saturation shows a state in which the output power of the second amplifier 7 is equal to the saturation electric power.

The time of backoff shows a state in which the output power of the second amplifier 7 is lower than the saturation electric power, and in which the peak amplifier 13 can perform a signal amplification operation.

Figure 5:
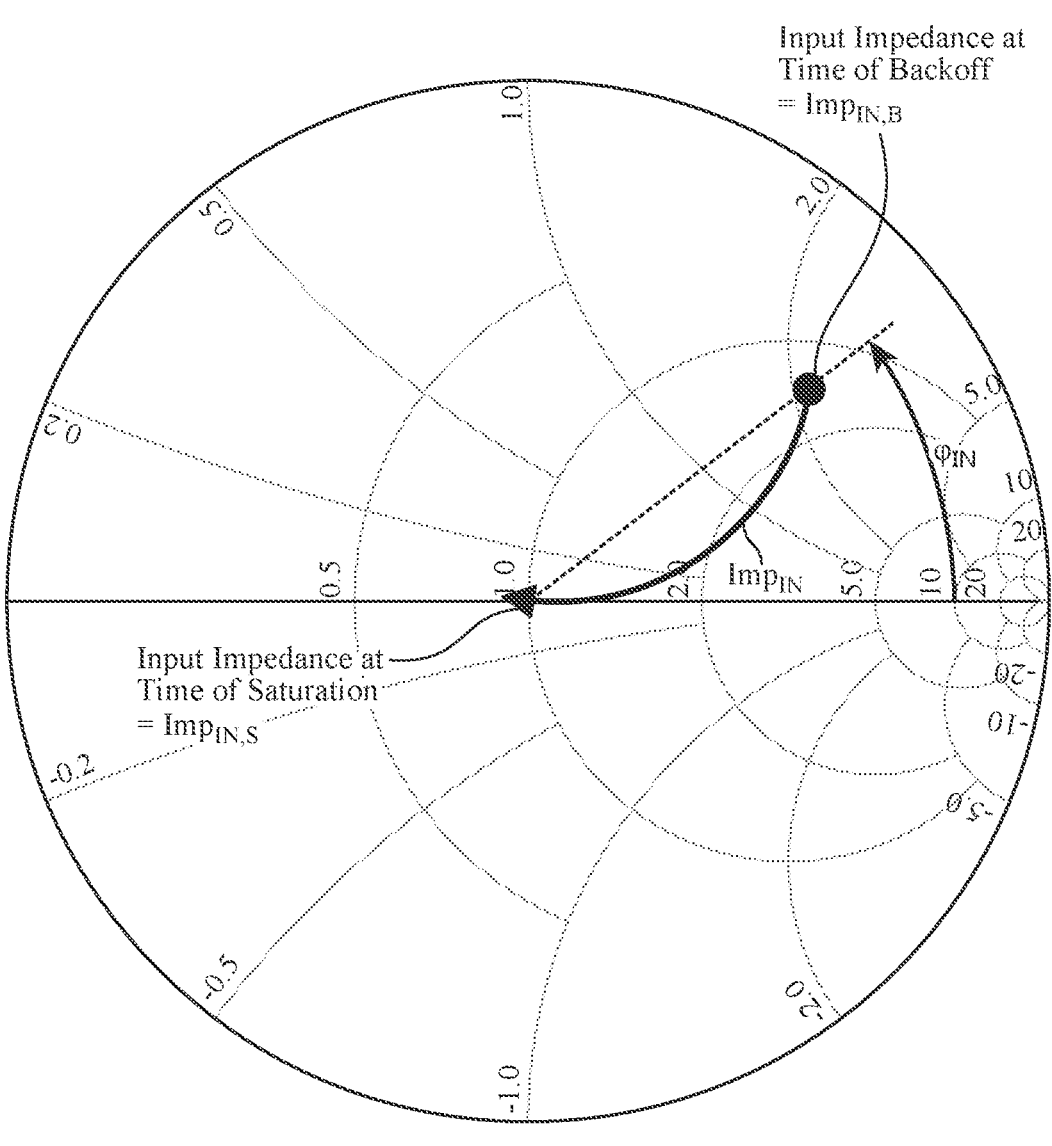
FIG. 5 is a Smith chart showing the input impedance $Imp_{IN}$ of the second amplifier 7.

FIG. 5 is a Smith chart showing the input impedance $Imp_{IN}$ of the second amplifier 7.

In the Smith chart shown in FIG. 5, the input impedance $Imp_{IN,S}$ of the second amplifier 7 at the time of saturation is shown at the center of the Smith chart.

The input impedance of the second amplifier 7 at the time of backoff is $Imp_{IN,B}$, as shown in FIG. 5, and the input reflection phase of the second amplifier 7 at the time of backoff is $\phi_{IN}$, as shown in FIG. 5. The absolute value of the input reflection phase $\phi_{IN}$ of the second amplifier 7 at the time of backoff is larger than zero.

Figure 6:
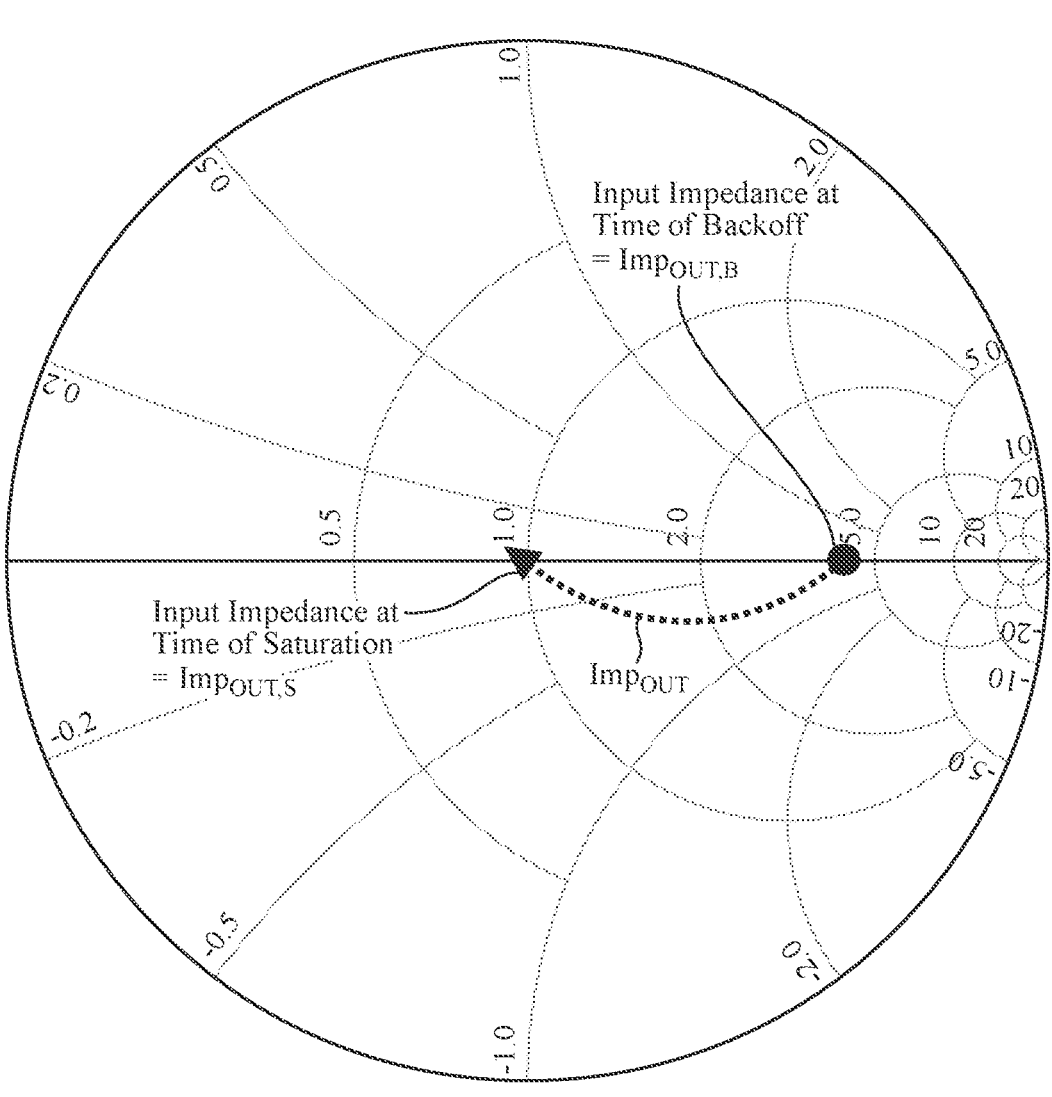
FIG. 6 is a Smith chart showing the impedance $Imp_{OUT}$ seen on the second amplifier 7 side from the current source 22 of the first amplifier 3.

FIG. 6 is a Smith chart showing the impedance $Imp_{OUT}$ seen on the second amplifier 7 side from the current source 22 of the first amplifier 3.

The impedance $Imp_{OUT}$ varies during the time period from the time of backoff of the second amplifier 7 to the time of saturation of the second amplifier 7, as shown in FIG. 6.

In the Smith chart shown in FIG. 6, the impedance $Imp_{OUT,S}$ at the time of saturation is shown at the center of the Smith chart. When the impedance $Imp_{OUT}$ seen on the second amplifier 7 side from the current source 22 is the impedance $Imp_{OUT,S}$ at the time of saturation, the output power of the first amplifier 3 is the maximum power. More specifically, the output power of the first amplifier 3 is equal to the saturation electric power.

Because the input impedance $Imp_{IN}$ of the second amplifier 7 varies during the time period from the time of backoff to the time of saturation, the impedance $Imp_{OUT}$ seen on the second amplifier 7 side from the current source 22 also varies during the time period from the time of backoff to the time of saturation. The impedance at the time of backoff is $Imp_{OUT,B}$.

It is possible to transform the input impedance $Imp_{IN,S}$ of the second amplifier 7 at the time of saturation, by modifying the lumped constant elements included in the output matching circuit 4.

In the amplifier circuit shown in FIG. 1, the lumped constant elements included in the output matching circuit 4 are designed in such a way that the input impedance $Imp_{IN,S}$ of the second amplifier 7 at the time of saturation is transformed, by the output matching circuit 4, to the impedance $Imp_{OUT,S}$ at which the output power of the first amplifier 3 is the maximum power.

In the case where the lumped constant elements included in the output matching circuit 4 are designed in the above-mentioned way, the impedance $Imp_{OUT}$ seen on the second amplifier 7 side from the current source 22 is matched with the impedance $Imp_{OUT,S}$ at which the output power of the first amplifier 3 is the maximum power.

It is possible to transform the input impedance $Imp_{IN,B}$ of the second amplifier 7 at the time of backoff, by modifying the lumped constant elements included in the output matching circuit 4.

In the amplifier circuit shown in FIG. 1, the lumped constant elements included in the output matching circuit 4 are designed in such a way that the impedance $Imp_{OUT,B}$ seen on the second amplifier 7 side from the current source 22 at the time of backoff is transformed, by the output matching circuit 4, to impedance higher than the impedance $Imp_{OUT,S}$ seen on the second amplifier 7 side from the current source 22 at the time of saturation.

Concretely, the lumped constant elements included in the output matching circuit 4 are designed in such a way that the absolute value of the sum total of the transmission phase $\phi_{PAR}$ of the parasitic component from the current source 22 to the one end of the output matching circuit 4, the transmission phase $\phi_{LPF}$ of the LPF type matching circuit 5, the transmission phase $\phi_{HPF}$ of the HPF type matching circuit 6 and the input reflection phase $\phi_{IN}$ of the second amplifier 7 is equal to or less than a threshold Th. The threshold Th is assumed to be equal to or greater than 0 and equal to or less than 45, for example.

For example, in a case where 0 is used as the threshold Th, and where the lumped constant elements included in the output matching circuit 4 are designed in such a way that the absolute value of the sum total is 0 degrees, the input reflection phase $\phi_{IN}$ of the second amplifier 7 is transformed to 0 degrees, and the efficiency of the first amplifier 3 when the second amplifier 7 performs a backoff operation has a maximum.

FIG. 7 is a Smith chart showing an example of the impedance transformation by the output matching circuit 4.

In FIG. 7, it is assumed that the input impedance $Imp_{IN,S}$ of the second amplifier 7 at the time of saturation is 50Ω, and the impedance $Imp_{OUT,S}$ at which the output power of the first amplifier 3 is the maximum power is 75Ω.

L1 denotes the inductance of the first inductor 31, L2 denotes the inductance of the second inductor 32, and L3 denotes the inductance of the inductor 23 which is apart of the parasitic component.

C1 denotes the capacitance of the capacitor 33, and C2 denotes the capacitance of the capacitor 24 which is a part of the parasitic component.

In the Smith chart shown in FIG. 7, the input impedance $Imp_{IN,S}$ of the second amplifier 7 at the time of saturation is shown at the center of the Smith chart.

Further, in the Smith chart shown in FIG. 7, the impedance transformation at the time of saturation is expressed by a dotted line, and the impedance transformation at the time of backoff is expressed by a solid line.

At the time of saturation of the second amplifier 7, the input impedance $Imp_{IN,S}$ of the second amplifier 7 is transformed, by C1, L2, L1+L3 and C2, to 75Ω which is the impedance $Imp_{OUT,S}$ at which the output power of the first amplifier 3 is the maximum power (see the dotted line of FIG. 7).

At the time of backoff of the second amplifier 7, the input impedance $Imp_{IN,B}$ of the second amplifier 7 is transformed, by C1, L2, L1+L3 and C2, to the impedance $Imp_{OUT,B}$ higher than the impedance $Imp_{OUT,S}$ at which the output power of the first amplifier 3 is the maximum power (see the solid line of FIG. 7). The impedance $Imp_{OUT,B}$ is on the real axis of the Smith chart, as shown in FIG. 7.

At the time of backoff of the second amplifier 7, the input impedance $Imp_{IN,B}$ of the second amplifier 7 is transformed to the impedance $Imp_{OUT,B}$ higher than the impedance $Imp_{OUT,S}$ at which the output power of the first amplifier 3 is the maximum power. Further, the input impedance $Imp_{IN,B}$ of the second amplifier 7 is transformed onto the real axis of the Smith chart. Therefore, a high-efficiency operation of the first amplifier 3 at the time of backoff can be implemented.

Therefore, in the amplifier circuit shown in FIG. 1, when the inductances L1 and L2 and the capacitance C1 are designed on the basis of the inductance L3 and the capacitance C2 in such a way that the Smith chart shown in FIG. 7 is applied, a high-efficiency operation of the first amplifier 3 at the time of backoff can be implemented while the maximum output power of the first amplifier 3 at the time of saturation is maintained.

Figure 8:
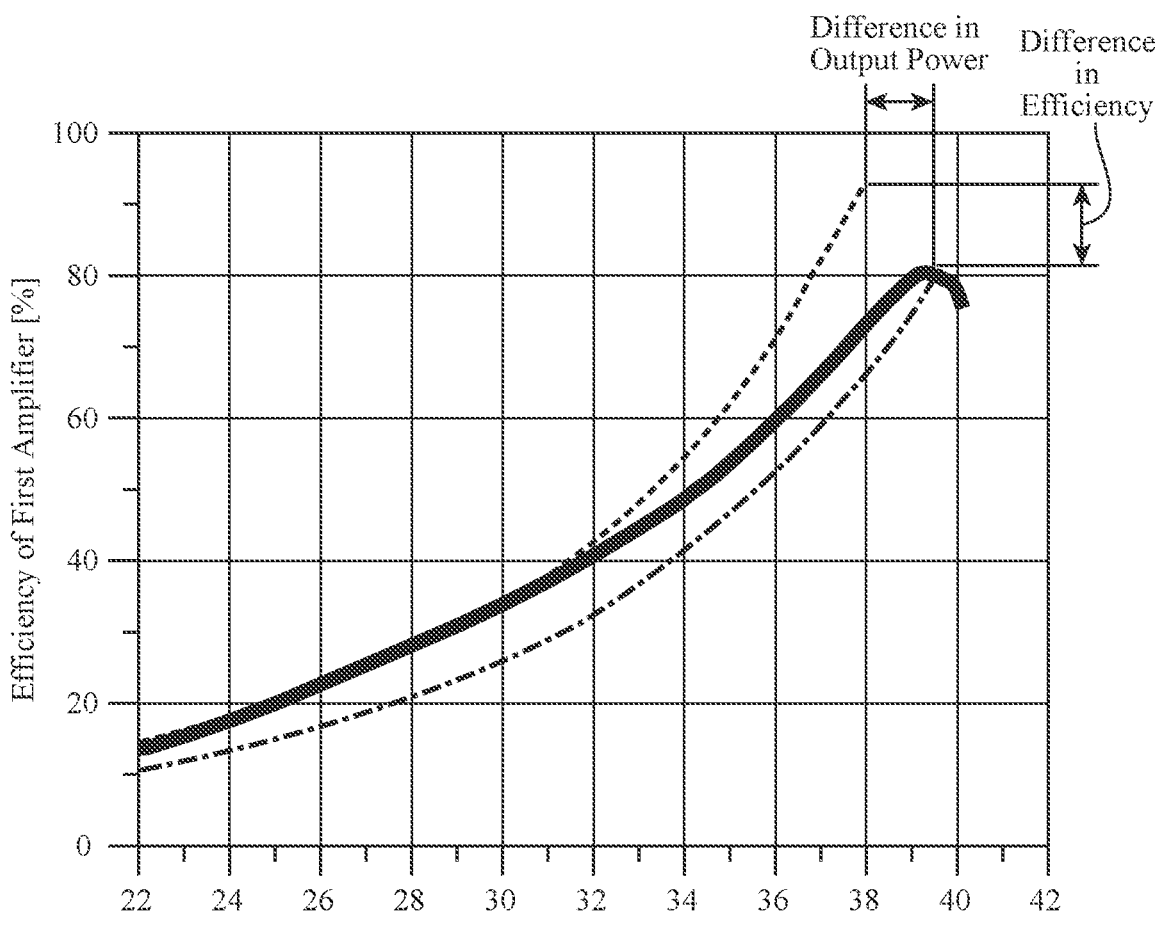
FIG. 8 is an explanatory drawing showing the efficiency of the first amplifier 3 in the amplifier circuit shown in FIG. 1.

FIG. 8 is an explanatory drawing showing the efficiency of the first amplifier 3 in the amplifier circuit shown in FIG. 1.

In FIG. 8, the horizontal axis shows the output power [dBm] of the first amplifier 3, and the vertical axis shows the efficiency [%] of the first amplifier 3.

In FIG. 8, the efficiency characteristic of the first amplifier 3 in the amplifier circuit shown in FIG. 1 is expressed by a solid line. In FIG. 8, the efficiency characteristic of the first amplifier 3 when 0 is used as the threshold Th and the lumped constant elements included in the output matching circuit 4 are designed in such a way that the absolute value of the sum total is 0 degrees is shown.

A dotted line shows the efficiency characteristic of the first amplifier 3 (referred as the "first assumptive efficiency characteristic" hereinafter) when it is assumed that the impedance $\mathrm{Imp}_{OUT}$ seen on the second amplifier 7 side from the current source 22 is fixed to the input impedance $\mathrm{Imp}_{IN,B}$ of the second amplifier 7 at the time of backoff. The time of backoff here shows a state in which the signal level of a signal outputted from the splitter 11 is the lowest signal level, out of states in which the peak amplifier 13 can perform a signal amplification operation.

An alternate long and short dash line shows the efficiency characteristic of the first amplifier 3 (referred as the "second assumptive efficiency characteristic" hereafter) when it is assumed that the impedance $\mathrm{Imp}_{OUT}$ seen on the second amplifier 7 side from the current source 22 is fixed to the input impedance $\mathrm{Imp}_{IN,S}$ of the second amplifier 7 at the time of saturation.

The impedance $\mathrm{Imp}_{OUT,B}$ seen on the second amplifier 7 side from the current source 22 at the time of backoff is higher than the impedance $\mathrm{Imp}_{OUT,S}$ at the time of saturation. Therefore, the output power of the first amplifier 3 at the time of backoff is lower than that of the first amplifier 3 at the time of saturation, and the efficiency of the first amplifier 3 at the time of backoff is higher than that of the first amplifier 3 at the time of saturation.

Because the impedance $\mathrm{Imp}_{OUT}$ seen on the second amplifier 7 side from the current source 22 varies during the time period from the time of backoff to the time of saturation, the efficiency characteristic of the first amplifier 3 overlaps with the first assumptive efficiency characteristic shown by the dotted line at the time of backoff, and the efficiency characteristic of the first amplifier 3 overlaps with the second assumptive efficiency characteristic shown by the alternate long and short dash line at the time of saturation.

Therefore, the efficiency of the first amplifier 3 at the time of backoff is higher than the efficiency shown by the second assumptive efficiency characteristic.

The output power at the time of saturation of the first amplifier 3 is greater than the output power shown by the first assumptive efficiency characteristic.

In FIG. 8, the efficiency characteristic of the first amplifier 3 when 0 is used as the threshold Th and the lumped constant elements included in the output matching circuit 4 are designed in such a way that the absolute value of the sum total is 0 degrees is shown.

The efficiency characteristic of the first amplifier 3 when 45 is used as the threshold Th and the lumped constant elements included in the output matching circuit 4 are designed in such a way that the absolute value of the sum total is 45 degrees is lower than that of the first amplifier 3 when the lumped constant elements included in the output matching circuit 4 are designed in such a way that the absolute value of the sum total is 0 degrees.

However, the efficiency characteristic of the first amplifier 3 at the time of backoff when the lumped constant elements included in the output matching circuit 4 are designed in such a way that the absolute value of the sum total is 45 degrees is between the first assumptive efficiency characteristic shown by the dotted line and the second assumptive efficiency characteristic shown by the alternate long and short dash line. Therefore, even in the case where the lumped constant elements included in the output matching circuit 4 are designed in such a way that the absolute value of the sum total is 45 degrees, the efficiency of the first amplifier 3 at the time of backoff of is higher than the efficiency shown by the second assumptive efficiency characteristic.

Note that the efficiency characteristic of the first amplifier 3 when 90 is used as the threshold Th and the lumped constant elements included in the output matching circuit 4 are designed in such a way that the absolute value of the sum total is 90 degrees overlaps with the second assumptive efficiency characteristic shown by the alternate long and short dash line, so that a high-efficiency operation at the time of backoff cannot be implemented.

In above-mentioned Embodiment 1, the amplifier circuit is configured in such a way that the amplifier circuit includes: the first amplifier 3 to amplify a signal to be amplified; the output matching circuit 4 through which the signal amplified by the first amplifier 3 propagates; and the second amplifier 7 to amplify the signal which has propagated through the output matching circuit 4, and the output matching circuit 4 is a lumped constant circuit including multiple lumped constant elements, and, by using the multiple lumped constant elements, transforms the impedance seen on the second amplifier 7 side from the first amplifier 3 when the output power of the second amplifier 7 is lower than the saturation electric power, to impedance higher than the impedance seen on the second amplifier 7 side from the first amplifier 3 when the output power of the second amplifier 7 is equal to the saturation electric power. Therefore, the amplifier circuit makes it possible to improve the efficiency of the first amplifier 3 when the output power of the second amplifier 7 is lower than the saturation electric power, without having to use a distributed constant circuit.

In the amplifier circuit shown in FIG. 1, the output matching circuit 4 includes the first inductor 31, the second inductor 32 and the capacitor 33 as the multiple lumped constant elements. The impedance $\mathrm{Imp}_{OUT,B}$ at the time of backoff is transformed, by the first inductor 31, the second inductor 32 and the capacitor 33, to impedance higher than the impedance $\mathrm{Imp}_{OUT,S}$ at the time of saturation.

However, what is necessary is just to be able to transform the impedance $\mathrm{Imp}_{OUT,B}$ at the time of backoff to impedance higher than the impedance $\mathrm{Imp}_{OUT,S}$ at the time of saturation, and the output matching circuit 4 is not limited to the one including the first inductor 31, the second inductor 32 and the capacitor 33 as the multiple lumped constant elements.

More specifically, the output matching circuit 4 should just include lumped constant elements which make the transmission phase of the output matching circuit 4 be $\phi_{LPF}+\phi_{HPF}$. Therefore, the output matching circuit 4 may provide the transmission phase $\phi_{LPF}+\phi_{HPF}$ by including a combination of any lumped constant elements out of a series inductor, a parallel inductor, a series capacitor, a parallel capacitor, a series resistor, and a parallel resistor.

Embodiment 2

In the amplifier circuit shown in FIG. 1, the second amplifier 7 is implemented by a Doherty amplifier.

In Embodiment 2, an amplifier circuit in which a second amplifier 7 is implemented by an envelope tracking amplifier will be explained.

The configuration of the amplifier circuit according to Embodiment 2 is the same as that of the amplifier circuit according to Embodiment 1, and a schematic diagram showing the amplifier circuit according to Embodiment 2 is FIG. 1.

The envelope tracking amplifier is an amplifier whose input impedance $Imp_{IN}$ varies, like Doherty amplifiers. Input impedance $Imp_{IN,S}$ at a time of saturation in the envelope tracking amplifier and input impedance $Imp_{IN,S}$ at a time of backoff in the envelope tracking amplifier are different from each other.

Figure 9:
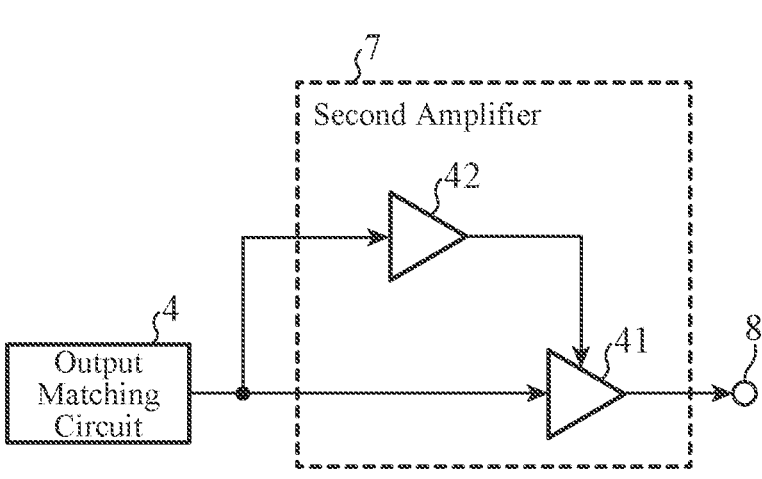
FIG. 9 is a schematic diagram showing a second amplifier 7 implemented by an envelope tracking amplifier.

FIG. 9 is a schematic diagram showing the second amplifier 7 implemented by the envelope tracking amplifier.

The envelope tracking amplifier which is the second amplifier 7 includes a high frequency amplifier 41 and a power supply modulator 42.

The high frequency amplifier 41 amplifies a signal which has propagated through an output matching circuit 4.

The high frequency amplifier 41 outputs the amplified signal to an output terminal 8.

The power supply modulator 42 supplies a power supply voltage corresponding to the amplitude of the signal which has propagated through the output matching circuit 4 to the high frequency amplifier 41.

The power supply voltage supplied from the power supply modulator 42 to the high frequency amplifier 41 varies dependently on a variation in the amplitude of the signal which has propagated through the output matching circuit 4.

In the high frequency amplifier 41, the input impedance $Imp_{IN}$ varies because the power supply voltage supplied from the power supply modulator 42 varies.

In above-mentioned Embodiment 2, the amplifier circuit is configured in such a way that the second amplifier 7 is implemented by the envelope tracking amplifier. The amplifier circuit according to Embodiment 2 makes it possible to improve the efficiency of a first amplifier 3 when the output power of the second amplifier 7 is lower than saturation electric power, without having to use a distributed constant circuit, like the amplifier circuit according to Embodiment 1.

Note that, it is to be understood that in the present disclosure, any combination of the above-mentioned embodiments can be made, various changes can be made in any component according to any one of the above-mentioned embodiments, or any component according to any one of the above-mentioned embodiments can be omitted.

INDUSTRIAL APPLICABILITY

The present disclosure is suitable for an amplifier circuit that amplifies a signal.

REFERENCE SIGNS LIST

1 input terminal, 2 input matching circuit, 3 first amplifier, 4 output matching circuit, 5 LPF type matching circuit, 6 HPF type matching circuit, 7 second amplifier, 8 output terminal, 11 splitter, 12 carrier amplifier, 13 peak amplifier, 14 90-degree line, 15 combiner, 21 transistor, 22 current source, 23 inductor, 24 capacitor, 31 first inductor, 32 second inductor, 33 capacitor, 34 direct current (DC) blocking capacitor, 41 high frequency amplifier, and 42 power supply modulator.

The invention claimed is:

1. An amplifier circuit comprising:
a first amplifier to amplify a signal to be amplified;
an output matching circuit through which the signal amplified by the first amplifier propagates; and
a second amplifier to amplify the signal which has propagated through the output matching circuit, wherein
the output matching circuit is a lumped constant circuit including multiple lumped constant elements, and, by using the multiple lumped constant elements, transforms impedance seen on a side of the second amplifier from the first amplifier when output power of the second amplifier is lower than saturation electric power of the second amplifier, to impedance higher than impedance seen on the side of the second amplifier from the first amplifier when the output power of the second amplifier is equal to the saturation electric power of the second amplifier, and
the output matching circuit includes: as the multiple lumped constant elements,
a low pass filter type matching circuit that includes only one element corresponding to a first inductor having one end connected to an output side of the first amplifier; and
a high pass filter type matching circuit that includes
a second inductor having one end connected to the other end of the first inductor, and having the other end grounded; and
a capacitor having one end connected to each of the following ends: the other end of the first inductor, and the one end of the second inductor, and having the other end connected to an input side of the second amplifier.

2. The amplifier circuit according to claim 1, wherein the output matching circuit, by using the multiple lumped constant elements, transforms the impedance seen on the side of the second amplifier from the first amplifier when the output power of the second amplifier is lower than the saturation electric power, according to a condition that an absolute value of a sum total of a transmission phase of a parasitic component included in the first amplifier, a transmission phase of the output matching circuit and an input reflection phase of the second amplifier is equal to or less than a threshold.

3. The amplifier circuit according to claim 2, wherein the threshold is 45 degrees, and, the output matching circuit, by using the multiple lumped constant elements, transforms the impedance seen on the side of the second amplifier from the first amplifier when the output power of the second amplifier is lower than the saturation electric power, according to the condition that the absolute value of the sum total is equal to or less than 45 degrees.

4. The amplifier circuit according to claim 2, wherein the threshold is 0 degrees, and, the output matching circuit, by using the multiple lumped constant elements, transforms the impedance seen on the side of the second amplifier from the first amplifier when the output power of the second amplifier is lower than the saturation electric power, according to the condition that the absolute value of the sum total is equal to 0 degrees.

5. The amplifier circuit according to claim 1, wherein the second amplifier is a Doherty amplifier.

6. The amplifier circuit according to claim 1, wherein the second amplifier is an envelope tracking amplifier.

7. The amplifier circuit according to claim 1, wherein the output matching circuit includes no distributed constant circuit corresponding to a transmission line.

* * * * *